US006982030B2

(12) United States Patent
Zhang et al.

(10) Patent No.: US 6,982,030 B2
(45) Date of Patent: Jan. 3, 2006

(54) REDUCTION OF SURFACE OXIDATION DURING ELECTROPLATING

(75) Inventors: Yun Zhang, Warren, NJ (US); Robert A. Schetty, III, Ft. Salonga, NY (US); Kilnam Hwang, Melville, NY (US)

(73) Assignee: Technic, Inc., Plainview, NY (US)

( * ) Notice: Subject to any disclaimer, the term of this patent is extended or adjusted under 35 U.S.C. 154(b) by 343 days.

(21) Appl. No.: 10/305,547

(22) Filed: Nov. 27, 2002

(65) Prior Publication Data

US 2004/0099340 A1 May 27, 2004

(51) Int. Cl.

| | |
|---|---|
| ***C25D 3/56*** | (2006.01) |
| ***C23C 18/00*** | (2006.01) |
| ***C23C 30/00*** | (2006.01) |
| ***B05D 1/18*** | (2006.01) |
| ***B32B 15/01*** | (2006.01) |

(52) U.S. Cl. ...................... 205/238; 205/239; 205/244; 205/252; 205/258; 428/646; 428/655

(58) Field of Classification Search ................ 428/646, 428/655; 205/238, 239, 244, 252, 258; 106/1.12, 106/287.19, 287.29; 148/28; 427/436
See application file for complete search history.

(56) References Cited

U.S. PATENT DOCUMENTS

| | | | | |
|---|---|---|---|---|
| 4,541,903 A * | 9/1985 | Kyono et al. | ............... | 205/141 |
| 4,672,007 A * | 6/1987 | Teng et al. | ................. | 428/624 |
| 4,767,509 A * | 8/1988 | Gamblin et al. | .............. | 205/50 |
| 4,822,560 A * | 4/1989 | Oyama et al. | .............. | 420/470 |
| 4,994,329 A * | 2/1991 | Kaimasu et al. | ............ | 428/678 |
| 5,024,900 A * | 6/1991 | Kuruma et al. | ............. | 428/626 |
| 5,486,721 A * | 1/1996 | Herklotz et al. | ............ | 257/666 |
| 6,099,624 A * | 8/2000 | Martyak | .................... | 106/1.27 |
| 6,323,128 B1 * | 11/2001 | Sambucetti et al. | ........ | 438/678 |
| 6,518,873 B1 * | 2/2003 | O'Regan et al. | ............ | 338/190 |
| 6,673,470 B2 * | 1/2004 | Shigekuni et al. | .......... | 428/648 |
| 6,726,827 B2 * | 4/2004 | Khaselev et al. | ........... | 205/253 |
| 6,730,209 B2 * | 5/2004 | Abys et al. | ................. | 205/253 |
| 6,808,614 B2 * | 10/2004 | Khaselev et al. | ........... | 205/253 |
| 2004/0149588 A1 * | 8/2004 | Aiba et al. | | |

FOREIGN PATENT DOCUMENTS

| | | |
|---|---|---|
| JP | 54115787 A | 9/1979 |
| JP | 404267009 | 9/1992 |
| JP | 2002180226 | 6/2002 |

OTHER PUBLICATIONS

English Abstract for JP-2002180226-A (Jun. 2002).*
English Abstract for JP-63313696-A (Dec. 1988).*
English Abstract for JP-404267009-A (Sep. 1992).*
English Abstract for JP-54115787-A (Sep. 1979).*
Japanese Machine Translation of JP 2002180226, Yoichi et al, Lead-Free Tin Alloy Solder Plated Wire.*

* cited by examiner

*Primary Examiner*—John J. Zimmerman
*Assistant Examiner*—Jason L. Savage
(74) *Attorney, Agent, or Firm*—Winston & Strawn LLP

(57) ABSTRACT

Methods of providing improved metal coatings or metal deposits on a substrate, improvements in plating solutions that are used to provide such metal deposits and articles of the metal-coated substrates. The solderability of the metal coating is enhanced by incorporating trace amounts of phosphorus in the metal coating to reduce surface oxide formation during subsequent heating and thus enhance long term solderability of the metal coating. The phosphorus is advantageously provided in the metal coating by incorporating a source of phosphorus in a solution that is used to provide the metal coating on the substrate, and the metal coating is then provided on the substrate from the solution.

16 Claims, No Drawings

REDUCTION OF SURFACE OXIDATION DURING ELECTROPLATING

BACKGROUND ART

The present invention relates to a solution and process for reducing or minimizing surface oxidation of a metal deposit provided by a plating process such as electroplating. The solutions and processes also provide improved deposit properties including appearance and solderability.

Electroplated tin and tin alloy coatings have been used in electronics and other applications such as wire, and continued steel strip for many years. In electronics, they have been used as a solderable and corrosion resistive surface finish for contacts and connectors. They are also used a lead finish for integrated circuit ("IC") fabrication. In addition, a thin layer of tin or tin alloy is applied as the final step for passive components such as capacitors and transistors.

Though applications vary, there are some commonalities regarding the requirements for this final surface finish. One issue is long term solderability, defined as the ability of the surface finish to melt and make a good solder joint to other components without defects that would impair the electrical or mechanical connection.

There are many factors that determine good solderability, the three most important of which are extent of surface oxide formation, amount of codeposited carbon, and extent of intermetallic compound formation. Surface oxide formation is a natural occurring process because it is thermodynamically favorable. The rate of formation of the surface oxide depends on the temperature and time. In another words, the higher the temperature and longer the time, the thicker the surface oxide that is formed. In the case of electroplated tin or tin alloy coatings or deposits, surface oxide formation also depends on the surface morphology of the coating or deposit. When comparing pure tin to tin alloy coatings, for example, tin alloys generally form less or thinner surface oxides when all other conditions are equal.

Codeposited carbon is determined by the plating chemistry one chooses to use. Bright finishes contain higher carbon contents than matte finishes. Matte finishes are normally rougher than the bright finishes, and provide an increased surface area that results in the formation of more surface oxides than typically are formed with a bright finish. The plater thus has a trade off between potential amount of surface oxide and surface finish.

Intermetallic compound formation is a chemical reaction between the tin or tin alloy coating and the substrate. The rate of formation depends on temperature and time as well. Higher temperatures and longer times result in a thicker layer of intermetallic compounds.

To improve or ensure the highest degree of solderability, it is important to 1) use a non-bright tin or tin alloy plating solution, 2) deposit a sufficient layer of tin or tin alloy so that surface oxide or intermetallic compound formation will not consume the entire layer, and 3) to prevent or minimize exposure of the tin plated surface to elevated temperatures for extend periods of time.

It is relatively easy to achieve 1) and 2), but it is very difficult to achieve 3). The temperature and time of subsequent part treatment after plating of a tin or tin alloy deposit is normally dictated by the assembly specifications and existing manufacturing layout and practice. For example, in "two tone" leadframe technology, after the tin or tin alloy plating, the entire package will have to go through many process steps (i.e., a long period of time for such treatments) which require multiple thermal excursions at temperatures as high as 175° C. Inevitably, more and/or thicker surface oxides form, and this in turn reduces the solderability of the tin or tin alloy deposit. In current processing, it is not possible to omit these additional steps since the final components or assemblies will not be complete.

Therefore it is highly desirable to find ways to prevent or minimize surface oxide formation on such parts. One known way to do this is to introduce a conformal coating on the surface of the tin or tin alloy deposit. This technology can be summarized in two general categories: one that applies a precious metal coating and the other that applies an organic coating. The first category is undesirable for protection of tin or tin alloy deposits because it introduces an expensive, extra process step. The second category is also undesirable because it will inevitably introduce impurities onto other critical areas of the leadframe or electrical component due to the non-selective nature of the organic coating that is deposited. These impurities have proven to be detrimental to the subsequent leadframe and IC assembly processes.

Accordingly, further solutions to this problem are needed, and these are now provided by the present invention.

SUMMARY OF THE INVENTION

The invention generally relates to methods of providing improved metal coatings or metal deposits on a substrate and to articles of the metal-coated substrates.

The invention relates to a method for enhancing the solderability of a metal coating on a substrate by incorporating trace amounts of phosphorus in the metal coating to reduce surface oxide formation during subsequent heating and thus enhance long term solderability of the metal coating. The phosphorus is advantageously provided in the metal coating by incorporating a source of phosphorus in a solution that is used to provide the metal coating on the substrate, so that the phosphorus is provided with the metal coating on the substrate from the solution.

Preferably, the metal coating is a metal deposit provided by electroplating and the source of phosphorus is added to a solution of ions of the metal so that phosphorus can be co-deposited along with the metal during electroplating. The source of phosphorus is typically a compound of phosphorus that is soluble in the solution and which provides ppm levels of phosphorus in the metal deposit. Generally, the metal deposit is produced by electroplating at a current density of no greater than about 2000 ASF.

Another embodiment of the invention relates to the plating solution that is used to provide a metal deposit on a substrate. This solution incorporates a source of phosphorus therein in an amount to provide trace amounts of phosphorus in the metal deposit to reduce surface oxide formation and thus enhance long term solderability of the metal deposit. The phosphorus is typically present in the resulting metal deposit in a detectable amount but less than about 200 ppm. It can also be much lower than this in certain metal deposits.

The invention also relates to an article comprising a metal coating on a substrate wherein the metal coating includes trace amounts of phosphorus therein to reduce surface oxide formation and thus enhance long term solderability of the metal deposit. Preferably, the article is produced by electroplating.

The metal of the metal coating, metal deposit or articles of the invention preferably comprises tin or a tin alloy, since these are typically utilized when soldering of the article is necessary for further manufacture. Deposits of nickel, cobalt, copper or their alloys are also desirable.

DETAILED DESCRIPTION OF THE PREFERRED EMBODIMENTS

This invention realizes the importance of incorporating trace amounts or ppm levels of phosphorus in metal or metal alloy deposits or plated coatings. This element significantly reduces surface oxidation of such coatings or deposits therefore improving long term solderability. Since phosphorus preferably can be added to the metal coating or deposit through the same manufacturing step that is used to deposit the metal, it does not require additional processing steps nor does it introduce impurities onto the entire package.

The term "trace amounts" is used to mean a detectable amount of an element such as phosphorus that is present in a metal deposit and which amount provides a measurable improvement in the long term solderability of the metal deposit.

The term "ppm levels" stands for the amount in parts per million range of an element such as phosphorus that is present in a metal deposit to provide a measurable improvement in the long term solderability of the metal deposit.

The trace amounts or ppm levels can vary widely depending upon the specific metal deposit. For example, in nickel deposits the amount will be on the order of 200 ppm or less while for tin and tin alloys it will be on the order of 50 ppm or less.

This additive can be used for any metal deposit that is to be soldered. This includes, among others, tin, nickel, copper, cobalt, tungsten, zinc, or one of their alloys. Soldering is basically an attachment procedure that usually involves three materials: (1) the substrate; (2) the component or other device which is desired to be attached to the substrate; and (3) the soldering material itself. The soldering material itself usually is a tin or tin alloy, but the substrate or component/device can be made of other metals. In the present invention, phosphorous is added to the metal deposit to improve the solderability properties of substrates that contain such deposits and/or the components/devices to be attached to them. The substrate or component/device material comprises an electroplatable material such as copper, steel, or stainless steel. The invention reduces the surface oxidation of the substrate and/or device which improves its ability to be soldered with the soldering material. It can also reduce the formation of intermetallic compounds for his purpose. Tin and tin alloy deposits are preferred as metal deposits since they act as solders on their own or can be subjected to reflow when heated above their relatively low melting temperatures. However, the reductions in surface oxidation is useful for the other metals recited since it is easier for solders to adhere to those metals due to reduced interference from oxidized surfaces. For example, when phosphorus is present in a nickel deposit, it may eliminate the need for a further coating of tin, a tin alloy or a precious metal.

Tin and tin alloys are known to have various plating chemistries that can produce various characteristics in the resulting plated deposits. These include appearances of matte, bright and others (e.g., satin bright). These can be achieved by a number of known chemistries based on sulfonates, mixed acids, sulfates, halogens, fluoborates, gluconates, citrates and the like. For environmental reasons, sulfonic acids, such as alkyl or alkylol sulfonic acids (e.g., methane sulfonic acid), are preferred. In addition, the skilled artisan would know that these baths may contain various additives to facilitate or enhance plating performance. Examples of preferred chemistries include U.S. Pat. Nos. 6,251,253; 6,248,228; 6,183,619; and 6,179,185; the content of each of which is expressly incorporated herein by reference thereto. These patents also disclose plating solutions and processes for other metals besides tin.

According to the invention, the plating solution can be modified with the addition of a small amount of a source of phosphorus. The phosphorus source can be an organic or inorganic phosphorus compound that is at least partially and preferably highly or fully soluble in the plating solution. Various alkali or alkaline earth phosphites or phosphates can be used, with hypophosphites being preferred. Hypophosphorous acid as well as pyrophosphides can be used, if desired. These compounds can be used in a wide rage of concentrations, and the skilled artisan can conduct routine tests to determine the optimum concentration for any particular bath formulation. It has been found that between 0.5 to 15 g/l and preferably from about 1 to 10 g/l of phosphorus compound are suitable for most conventional baths. The examples illustrate a preferred concentration range of between 1 and 5 g/l for certain compounds in tin or tin alloy baths.

It has been found that phosphorus can be deposited over a wide range of electroplating conditions depending upon the specific metal to be plated. Generally, current densities of less than about 2000 ASF are used. Depending upon the specific plating equipment, current densities of less than 1000 ASF, less than 500 ASF or even between 25 and 150 ASF can be used. With higher current densities, metal deposits are made more quickly so that lower amounts of phosphorus found in the deposit. The bath formulator should add a sufficient amount of the phosphorus source so that the amount of phosphorus in the deposit is detectable. One way to do this is to increase the amount of phosphorus source in the bath, but this is not preferred since it can affect bath stability of other performance criteria. Instead, it is much easier to control the current density to the desirable ranges mentioned above since small amounts of the phosphorus source can be used without affecting or significantly impacting overall bath chemistry.

The substrates to be plated can vary over a wide variety. Of course, the usual metal substrates, such as copper steel or stainless steel are typically used, but the invention is also operable on composite substrates that include conductive and non-conductive or electroplatable and non-electroplatable portions. This provides the plater with a number of options for manufacturing may different types of parts or articles with the phosphorus containing deposits of the invention.

The resulting plated products can be used in a number of different applications in the fields of electronics, wire coating, steel plating, tinplate and others where enhanced solderability of reflow properties are needed. It has been found that incorporating phosphorus in the deposit helps to significantly reduce surface oxidation in deposits that have matte or bright finishes. As noted, this results in improved solderability performance.

EXAMPLES

The following examples are used to illustrate the most preferred solutions and processes for the present invention.

Example 1

The following electroplating solution was prepared for obtaining a satin/matte tin deposit:

45 g/l tin as stannous sulfate
80 g/l sulfuric acid
15 g/l sodium isotheonate 5 g/l surfactant
20 ppm grain refiner
phosphorus source: $NaH_2PO_2$
balance water Example 2

The following electroplating solution was prepared for obtaining a satin/matte tin-lead deposit:
63 g/l tin as stannous sulfate
7 g/l lead as lead methane sulfonate
100 g/l methane sulfonic acid
15 g/l sodium isotheonate
5 g/l surfactant
20 ppm grain refiner
phosphorus source: $NaH_2PO_2$
balance water Example 3

The following electroplating solution was prepared for obtaining a bright tin deposit:
50 g/l tin as stannous sulfate
80 g/l sulfuric acid
15 g/l sodium isotheonate
3 g/l surfactant
5 g/l brightening agent
phosphorus source: $NaH_2PO_2$
balance water Example 4

The following electroplating solution was prepared for obtaining a bright tin-lead deposit:
50 g/l tin as stannous sulfate
5 g/l lead as lead methane sulfonate
100 g/l methane sulfonic acid
15 g/l sodium isotheonate
3.5% surfactant
1.5% brightening agent
phosphorus source: $NaH_2PO_2$
balance water Example 5

The solutions of Examples 1–4 were plated on Hull cell panels under the following plating conditions:

Hull cell plating: 5 A, 1 minute at 110° F. with paddle agitation, copper and steel Hull cell panels Leadframe plating: 75 ASF: copper alloy and stainless steel substrates. Two sets of samples were plated: controls and samples containing P. The control samples were obtained from respective baths without the addition of the phosphorus source ($NaH_2PO_2$). The $NaH_2PO_2$ concentrations that were found to be beneficial in these examples are between 1–5 g/l.

P content determination: A wet method was used where the deposit is dissolved in nitric acid and ICP detection techniques are used to measure phosphorus content. The results showed that phosphorus content in each sample ranged from 1 to 7 ppm. In addition, reduced surface oxidation was encountered.

Solderability: Measures of solderability were determined using the Dip and Look, Wetting Balance and Surface Mount Solderability Test method per IPC/JEDEC Industry Standard J-STD-002A.

Examples 6–9

The following tests were performed to show that the incorporation of the ppm levels of phosphorus in the metal deposits of Examples 1–4 provided unexpectedly improved results with regard to improved solderability, reduced surface oxidation.

The deposits provided by the baths of Examples 1–4 was baked at 175° C. for 7 hours. Strips of stainless steel and copper Hull cell panels were put in an oven maintained at that temperature, and periodic checks were performed to observe whether any surface discoloration occurred. The presence of a yellowish surface discoloration would indicate surface oxidation.

Example 6

For the tin deposit produced by the bath of Example 1, stainless steel and copper panels, the control strips, i.e., the ones with deposits that did not have added phosphorus, showed discoloration after 5 hrs, and the discoloration was worse when the plating current density was below 100 ASF.

The stainless steel strips bearing deposits that contained phosphorus did not change color under the same conditions across the entire Hull cell panel. Furthermore, these strips did not change color after 7 hrs. The copper Hull cell panels with the phosphorus containing deposits showed a little yellowish color at current densities below 100 ASF, but they looked appreciably better than the controls.

Solderability tests were conduced after the 7 hour baking, with the following results:

Controls: samples plated at 50, 100 and 150 failed

Samples with deposits containing phosphorus: all passed

Example 7

For the tin-lead deposits of Example 2, both the controls and the deposits containing phosphorus did not show discoloration after baking, indicating that surface oxidation can be further reduced with a tin alloy deposit.

All samples passed the solderability test, but the samples with deposits containing phosphorus showed improvement over the control.

Example 8

For the bright tin deposits of Example 3, all samples (both the controls and those with the deposits that contain phosphorus) did not change color after the 7 hour bake. These deposits were subject to reflow conditions with the results showing that the controls changed color to slight yellow after reflow while the samples with the deposits that contain phosphorus not showing any difference.

Example 9

For the bright tin-lead deposits of Example 4, all samples (both the controls and those with the deposits that contain phosphorus) did not change color after the 7 hour bake. These deposits were subject to reflow conditions with the results showing that the controls changed color to slight yellow after reflow while the samples with the deposits that contain phosphorus not showing any difference.

What is claimed is:

1. A method for enhancing the solderability of a metal coating that is plated on a substrate, which comprises providing an electroplating solution for depositing the metal coating on the substrate, adding sufficient amounts of phosphorus to the electroplating solution to provide a concentration of between 0.5 to 15 g/l for enabling the phosphorus to co-deposit with the metal, and electroplating the substrate by co-depositing phosphorus and the metal wherein the electroplated metal coating is produced by electroplating at a current density of no greater than about 2000 ASF with the current density controlled to achieve the desired quantity of phosphorus in the electroplated metal coating and with the phosphorus being present in the electroplated metal coating in trace amounts sufficient to reduce surface oxide formation on exposed portions of the electroplated metal coating during subsequent heating or processing operations to thus enhance long term solderability of the electroplated metal coating, wherein the electroplated metal coating is nickel, cobalt, copper, tungsten or tin.

2. The method of claim 1 where in the phosphorus is present in the electroplated metal coating in a detectable amount but less than about 200 ppm.

3. The method of claim 1 wherein the electroplated metal coating is tin.

4. The method of claim 3 wherein the phosphorus is present in the coating in a detectable amount but less than about 50 ppm.

5. The method of claim 1 wherein the electroplated metal coating is nickel.

6. The method of claim 5 wherein the phosphorus is present in the coating in a detectable amount but less than about 200 ppm.

7. The method of claim 1 wherein the phosphorus is provided in the metal coating by incorporating a source of phosphorus in the electroplating solution that is used to provide the metal coating on the substrate, wherein the phosphorus source comprises an organic or inorganic phosphorus compound that is at least partially soluble in the solution.

8. The method of claim 7 wherein the source of phosphorus is a compound of phosphorus that is completely soluble in the solution and which provides the desired levels of phosphorus in the electroplated metal coating.

9. The method of claim 7 wherein the phosphorus compound is an alkali or alkaline earth phosphite, hypophosphite, phosphate or pyrophosphide.

10. The method of claim 1 wherein the substrate is an electronic component that, after being plated, is subjected to further processing steps which require multiple thermal excursions at temperatures as high as 175° C.

11. The method of claim 10 wherein the electronic component comprises a circuit or lead frame.

12. The method of claim 10 wherein the substrate is made of copper, steel or stainless steel.

13. The method of claim 12 wherein the substrate is a composite substrate that includes conductive and non-conductive or electroplatable and non-electroplatable portions.

14. A method for enhancing the reflow properties of a metal coating that is plated on a substrate, which comprises providing an electroplating solution for depositing the metal coating on the substrate, adding sufficient amounts of phosphorus to the electroplating solution to provide a concentration of between 0.5 to 15 g/l for enabling the phosphorus to co-deposit with the metal, and electroplating the substrate by co-depositing phosphorus and the metal wherein the electroplated metal coating is produced by electroplating at a current density of no greater than about 2000 ASF with the current density controlled to achieve the desired quantity of phosphorus in the electroplated metal coating and with the phosphorus being present in the electroplated metal coating in trace amounts sufficient to reduce surface oxide formation on exposed portions of the electroplated metal coating during subsequent heating or processing operations, wherein the resulting electroplated substrate comprises a metal plating or tinplate having enhanced reflow properties due to the electroplated metal coating, wherein the electroplated metal coating is nickel, cobalt, copper, tungsten or tin.

15. The method of claim 14 wherein the metal coating is a tin coating.

16. The method of claim 15 which further comprises subjecting the plated substrates to a reflow operation to provide a bright tin deposit.

* * * * *

US006982030C1

(12) EX PARTE REEXAMINATION CERTIFICATE (7658th)

United States Patent

Zhang et al.

(10) Number: US 6,982,030 C1

(45) Certificate Issued: Aug. 3, 2010

(54) REDUCTION OF SURFACE OXIDATION DURING ELECTROPLATING

(75) Inventors: Yun Zhang, Warren, NJ (US); Robert A. Schetty, III, Ft. Salonga, NY (US); Kilnam Hwang, Melville, NY (US)

(73) Assignee: Technic, Inc., Plainview, NY (US)

Reexamination Request:
No. 90/008,221, Sep. 20, 2006

Reexamination Certificate for:

| | |
|---|---|
| Patent No.: | **6,982,030** |
| Issued: | **Jan. 3, 2006** |
| Appl. No.: | **10/305,547** |
| Filed: | **Nov. 27, 2002** |

(51) Int. Cl.

| | |
|---|---|
| ***B05D 1/18*** | (2006.01) |
| ***B32B 15/01*** | (2006.01) |
| ***C23C 18/00*** | (2006.01) |
| ***C23C 30/00*** | (2006.01) |
| ***C25D 3/56*** | (2006.01) |

(52) U.S. Cl. ........................ 205/238; 205/239; 205/244; 205/252; 205/258; 428/646; 428/655

(58) Field of Classification Search ........................ None
See application file for complete search history.

(56) References Cited

U.S. PATENT DOCUMENTS

| | | | | | |
|---|---|---|---|---|---|
| 3,437,571 | A | * | 4/1969 | Renzoni | 205/595 |
| 3,637,471 | A | | 1/1972 | Faulkner et al. | 205/258 |
| 3,673,680 | A | * | 7/1972 | Tanaka et al. | 29/837 |
| 3,950,234 | A | | 4/1976 | Faulkner et al. | |
| 4,113,248 | A | | 9/1978 | Yanagioka | 473/566 |
| 4,541,903 | A | | 9/1985 | Kyono et al. | 205/141 |
| 4,686,015 | A | * | 8/1987 | Samuels et al. | 361/748 |
| 4,814,947 | A | * | 3/1989 | Gunter | 361/540 |
| 4,935,310 | A | * | 6/1990 | Nakatsugawa | 428/607 |
| 4,994,329 | A | | 2/1991 | Kaimasu et al. | |
| 5,700,362 | A | | 12/1997 | Yano et al. | |
| 5,942,314 | A | * | 8/1999 | Fisher et al. | 428/198 |
| 6,099,624 | A | | 8/2000 | Martyak | |
| 6,117,566 | A | | 9/2000 | Matsumoto et al. | |
| 6,183,886 | B1 | | 2/2001 | Chen et al. | |
| 6,246,110 | B1 | * | 6/2001 | Kinsman et al. | 257/672 |
| 6,355,154 | B1 | | 3/2002 | Buratti | 205/109 |
| 6,406,611 | B1 | | 6/2002 | Engelhaupt et al. | 420/441 |
| 6,613,451 | B1 | | 9/2003 | Asahara et al. | |
| 6,700,185 | B1 | * | 3/2004 | Kawai et al. | 257/668 |
| 6,783,696 | B2 | | 8/2004 | Conte et al. | 252/181.1 |
| 6,797,409 | B2 | | 9/2004 | Ivey et al. | 428/635 |
| 2002/0164262 | A1 | | 11/2002 | Engelhaupt et al. | 420/441 |

FOREIGN PATENT DOCUMENTS

| | | | | |
|---|---|---|---|---|
| JP | 55031181 | A | | 3/1980 |
| JP | 58-48954 | A | * | 3/1983 |
| JP | 1-146347 | A | * | 6/1989 |
| JP | 4-267009 | A | * | 9/1992 |
| JP | 5-190725 | A | * | 7/1993 |
| JP | 2000-169996 | A | * | 5/2000 |
| JP | 2000-144482 | A | * | 6/2000 |
| JP | 2001-234386 | A | * | 8/2001 |
| WO | WO 00/15875 | | | 3/2000 |
| WO | WO00/15876 | | | 3/2000 |
| WO | WO 01/35460 | A1 | * | 5/2001 |

OTHER PUBLICATIONS

English translation of JP 4–267009 A, Sep. 1992.*

Japanese machine translation of JP 2002180226, Yoichi et al. Lead–Free Tin Alloy Solder Plated Wire. Jun. 26, 2002.

* cited by examiner

*Primary Examiner*—Alan Diamond

(57) ABSTRACT

Methods of providing improved metal coatings or metal deposits on a substrate, improvements in plating solutions that are used to provide such metal deposits and articles of the metal-coated substrates. The solderability of the metal coating is enhanced by incorporating trace amounts of phosphorous in the metal coating to reduce surface oxide formation during subsequent heating and thus enhance long term solderability of the metal coating. The phosphorus is advantageously provided in the metal coating by incorporating a source of phosphorus in a solution that is used to provide the metal coating on the substrate, and the metal coating is then provided on the substrate from the solution.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-16 are cancelled.

* * * * *